United States Patent [19]

Kim

[11] Patent Number: 5,375,630
[45] Date of Patent: Dec. 27, 1994

[54] PROCESS FOR FORMING LEAD FRAME OF QUAD FLAT SEMICONDUCTOR PACKAGE

[75] Inventor: Young S. Kim, Seoul, Rep. of Korea

[73] Assignee: Hyundai Electronics Industries Co., Ltd., Rep. of Korea

[21] Appl. No.: 77,781

[22] Filed: Jun. 15, 1993

[30] Foreign Application Priority Data

Oct. 21, 1992 [KR] Rep. of Korea .................... 92-19394

[51] Int. Cl.⁵ .............................................. B21F 45/00
[52] U.S. Cl. .................................................... 140/105
[58] Field of Search ......................................... 140/105

[56] References Cited

U.S. PATENT DOCUMENTS

| | | | |
|---|---|---|---|
| 4,103,718 | 8/1978 | Steigerwald | 140/105 |
| 4,558,581 | 12/1985 | Goulstone et al. | |
| 5,074,139 | 12/1991 | Elliot | |
| 5,135,034 | 8/1992 | Miyamoto | 140/105 |

Primary Examiner—Lowell A. Larson
Attorney, Agent, or Firm—Merchant, Gould, Smith, Edell, Welter & Schmidt

[57] ABSTRACT

A roll forming process and roll forming apparatus of a lead frame of quad flat a semiconductor package. The roll forming process comprises a roll forming step for bending using a form roller the plurality of leads into a predetermined bending shape while minimizing the frictional force between the form roller and the leads and a notching step for providing a pair of notches on the lead frame at opposite sides of the leads. The roll forming step is carried out between the trimming step and the lead cutting step, while the notching step is carried out at least before the roll forming step. The roll forming apparatus comprises a roll forming punch die including the form roller rotatably supported at its opposite sides by a pair of support holders. The form roller imparts an increasing bend to the package leads until the predetermined bending shape is achieved.

2 Claims, 3 Drawing Sheets

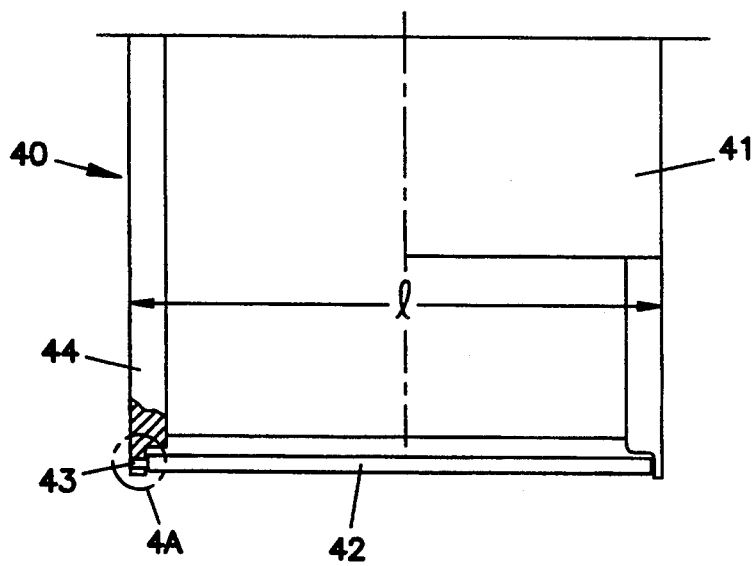
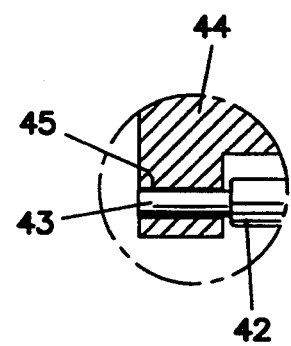
FIG. 4  FIG. 4A
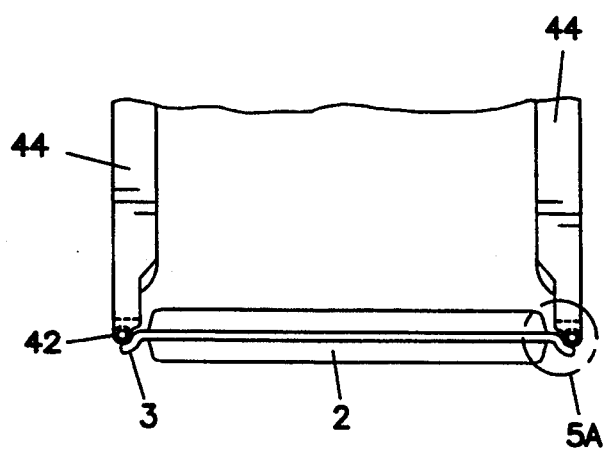
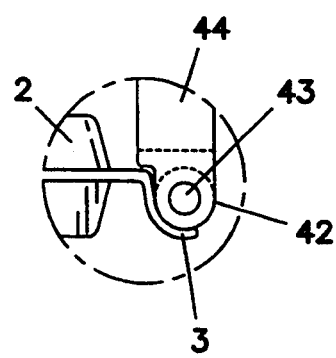
FIG. 5  FIG. 5A

PROCESS FOR FORMING LEAD FRAME OF QUAD FLAT SEMICONDUCTOR PACKAGE

BACKGROUND OF THE INVENTION

1. Field of the invention

The present invention relates in general to forming of semiconductor package lead frame, and more particularly to a process and apparatus for progressively forming a lead frame of a quad flat semiconductor package having fine pitch leads.

2. Description of the Prior Art

As well known to those skilled in the art, the production method of semiconductor packages generally includes a progressive forming process for providing individual semiconductor packages having a plurality of leads bent into a desired shape using a forming punch die.

With reference to FIGS. 1A, 1B and 2, a lead frame 1 holding a plurality of quad flat semiconductor packages 2 having fine pitch leads 3 progressively passes through a forming punch die 4 as shown at the arrow of FIGS. 1A and 1B and subjected to a progressive forming process. When the lead frame 1 holding the plurality of semiconductor packages 2 reaches the forming punch die 4, a trimming step is carried out for cutting dam bars of the lead frame 1 and followed by a progressive forming step. In the progressive forming step, the plurality of leads 3 of each of the packages 2 are progressively bent into a desired shape. At the last position of the forming punch die 4, individual semiconductor packages 2 having the bent leads 3 are cut free from the lead frame 1.

The conventional forming punch die 4 is equipped with an integrated type forming punch or a cam type forming punch. Otherwise stated, as shown in FIG. 2, a forming punch 5 of the cam type is provided at the lower section of the forming punch die 4. While the lead frame 1 progressively passes through the forming punch die 4, the cam type forming punch 5 performs a repeated vertical reciprocation with respect to the lead frame 1 and carries out the progressive forming for the leads 3, thereby bending the leads 3 into the desired shape. Here, the forming punch 5 reciprocates at a velocity higher than 50 SPM., so that there is generated a face frictional heat of a higher temperature between the contact surface of the reciprocating forming punch 5 and the leads 3.

The temperature of the face frictional heat generated between the forming punch 5 and the leads 3 is higher than a plating temperature of the plated lead frame 1, so that the plating material, such as tin, of the lead frame 1 is melted and builds up on the contact surface of the forming punch 5 or between the leads 3 having the fine pitch of about 0.2 mm to 0.3 mm.

The build-up of the plating material on the contact surface of the forming punch 5 causes a scratch on the leads 3, thereby deteriorating the quality of the resulting semiconductor package. On the other hand, when the plating material builds up between the leads 3 having a pitch ranging ranged from about 0.2 mm to 0.3 mm, these leads 3 are often electrically connected to each other through the build-up material causing a short circuit of the resulting semiconductor package. This results in deterioration of the reliability and the productivity of the semiconductor packages.

In addition, there has been proposed a progressive roll forming of a semiconductor package carried out using a plurality of roller sets, such as disclosed in U.S. Pat. No. 5,074,139. This U.S. patent discloses a method by which leads of a semiconductor package are bent into their final shape by employing a roll forming process. This roll forming process achieves a final form by passing a lead frame holding a plurality of semiconductor packages through a series of form rollers which progressively bend the leads into the final shape. However, this forming method has a problem in that it is not used for forming the leads of a quad flat semiconductor package (QFP) but is used for forming the leads of a dual inline semiconductor package (DIP).

SUMMARY OF THE INVENTION

It is, therefore, an object of the present invention to form the fine pitch leads of the QFP lead frame employing a roll forming process other than the conventional cam forming while providing notches on the QFP lead frame, thereby causing generation of a rolling frictional heat of a lower temperature instead of the conventional face frictional heat of a higher temperature between the fine pitch leads of the QFP lead frame and a form roller, and preventing build-up of the plating material of the lead frame between the fine pitch leads or on the forming roller.

To accomplish the above object, the present invention provides a forming process for a semiconductor package lead frame comprising a trimming step, a lead cutting step, a confirming step for confirming whether a plurality of leads are formed in a desired final shape and a package separating step for separating individual semiconductor packages free from the lead frame, and further comprising: a roll forming step for the leads into a desired bending shape using a form roller while minimizing the frictional force between the form roller and the leads, the roll forming step being carried out between the trimming step and the lead cutting step; and a notching step for providing a pair of notches on the lead frame at opposite sides of the leads, the notching step being carried out at least before the roll forming step. The present invention also provides an apparatus for forming a semiconductor package lead frame comprising a form roller rotatably supported at its opposite sides by a pair of support holders, the form roller imparting an increasing bend to the plurality of leads of the lead frame until the predetermined shape is achieved.

BRIEF DESCRIPTION OF THE DRAWINGS

The above and other objects, features and other advantages of the present invention will be more clearly understood from the following detailed description taken in conjunction with the accompanying drawings, in which:

FIGS. 1A and 1B show a lead frame holding a plurality of semiconductor packages and subjected to a progressive forming process in accordance with prior art, in which;

FIG. 1A is a plan view of the lead frame;
and
FIG. 1B is a side view of the lead frame.

FIG. 4 is a partially sectioned front view of a roll forming punch die in accordance with the present invention;

FIG. 4A is an enlarged view of a portion of the punch die shown in FIG. 4;

FIG. 5 is a side view showing a roll forming step for the leads of the lead frame into a desired bending shape using the roll forming punch die of FIG. 4; and FIG. 5A is an enlarged view of a portion of the punch die shown in FIG. 5.

DETAILED DESCRIPTION OF THE PREFERRED EMBODIMENTS

Figure 1A:
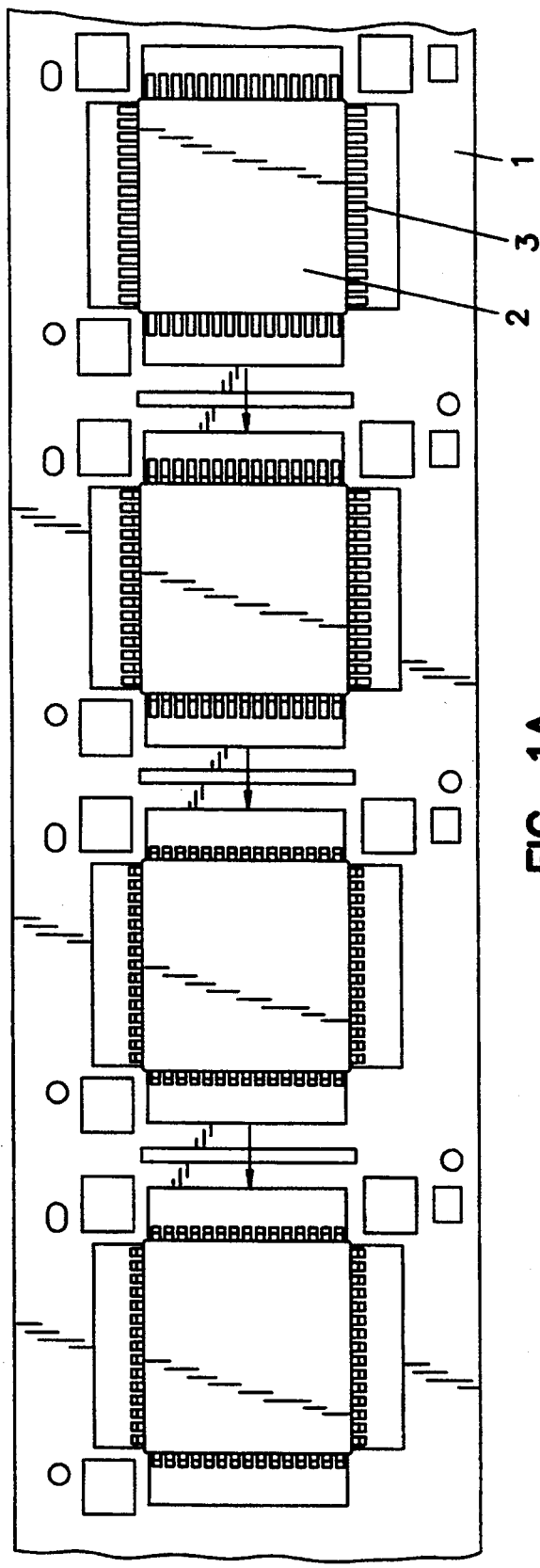
Figure 1B:
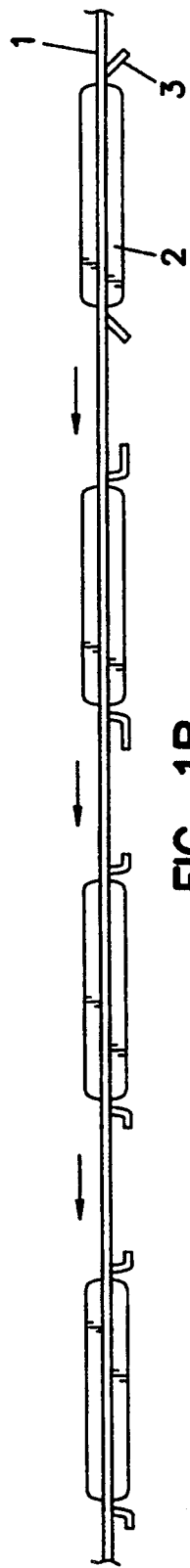
Figure 2:
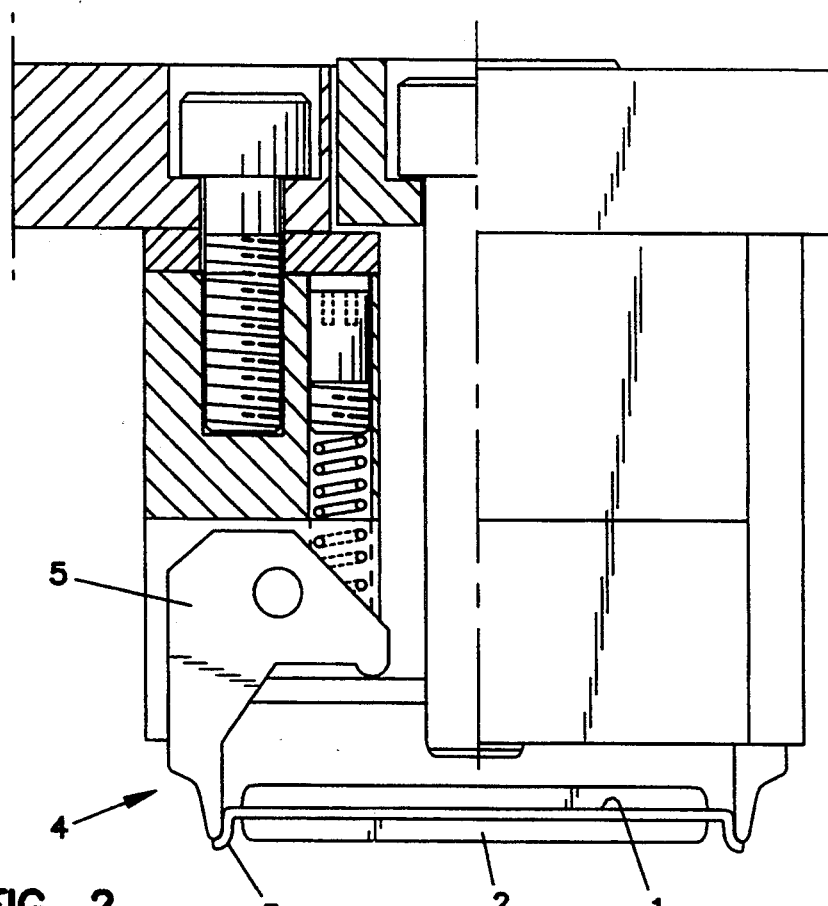
FIG. 2 is a quarter-sectioned view of a conventional cam forming punch die.

With reference to the FIGS. 1A and 1B showing a conventional progressive forming process, a QFP lead frame 1 holding a plurality of semiconductor packages 2 is fed to a progressive forming die and subjected to a progressive forming process in order to provide individual packages having bent leads 3. In this conventional progressive forming process, a trimming step is first carried out for cutting a dam bar of the lead frame 1 and forming a plurality of leads 3. The trimming step is followed by a forming step wherein the leads 3 are bent into a desired bending shape and, thereafter, a cutting step is carried out for cutting the leads 3 into a desired length, thereby causing the leads 3 to have a desired final shape. The cutting step is followed by a confirming step wherein it is confirmed whether the leads 3 have the desired final shape and the desired length. Thereafter, individual semiconductor packages 1 having the leads 3 are separated from the lead frame 1. In accordance with the present invention, the aforementioned progressive forming process further includes a notching step which is preferably carried out at the same time as the trimming step. In addition, the forming step is a roll forming step wherein the leads 3 are bent into the desired bending shape using a form roller 42 which generates a rolling friction when it rolls on the leads 3 of the lead frame 1, and will be described later herein. Thereafter, the cutting step, the confirming step and the separating step are progressively carried out.

Here, it is preferred to carry out the notching step at the same time as the trimming step as described above. However, it should be understood that the notching step may be independently carried out before or after the trimming step. Otherwise stated, the notching step may be carried out at least before the roll forming step.

Figure 3:
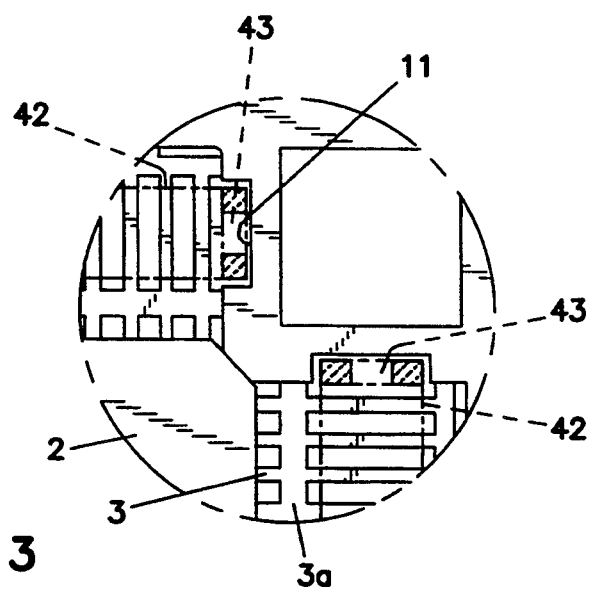
FIG. 3 is an enlarged view of a forming start section of a lead frame to be formed by a progressive roll forming process in accordance with the present invention.

FIG. 3 shows in phantom line a position of the form roller 42 of a roller forming punch die 40 with respect to a notch 11 which is formed as a result of notching the lead frame 1 before the trimming step, Here, the notching step is carried out before the trimming step, so that the pair of notches 11 are formed on the lead frame 1 at opposite sides of the plurality of leads 3. The notches 11 allow the roll forming step using the form roller 42 to be carried out with no hindrance. In the roll forming step, the form roller 42 rolls on the leads 3 and bends the leads 3 into the desired shape. In this case, a rolling frictional force is generated between the leads 3 and the form roller 42, thus causing the frictional heat to be scarcely generated therebetween. In this regard, such a roll forming step prevents melting of the plating material of the plated lead frame 1 due to the frictional heat and build-up of the plating material on the form roller 42. In the drawing, the reference numerals 3a and 43 denote the dam bar, supporting the leads 3, and a roll shaft of the form roller 42, respectively.

As a result of the notching step, the lead frame 1 is provided with the notches 11 at opposite sides of the leads 3. The notches 11 enlarge the spaces at opposite sides of the leads 3 and are preferably cut away such that the distance between the two notches 11 is longer than the distance 1 between a pair of punch holders 41 of the roll forming punch die 40, shown in Fig, 4 and described later herein. Thus, the pair of punch holders 41 smoothly passes through the notches 11 during the roll forming step while the form roller 42 rolls on the leads 3 and bends the leads 3 into the desired shape.

FIGS. 4 and 4A show a partially sectioned front view of the roll forming punch die 40 and an enlarged view of a portion thereof, respectively, and FIGS. 5 and 5a show a side view of the roll forming step for bending the leads 3 of the lead frame 1 into the desired bending shape using the roll forming punch die 40, and an enlarged view of a portion thereof, respectively. The roll forming punch die 40 comprises the form roller 42 having a length slightly longer than the distance between the outermost leads 3. In order to achieve the rolling support of the form roller 42 with respect to the punch holders 41 of the roll forming punch die 40, the form roller 42 is provided with a pair of roll support shafts 43 extending from the opposite ends of the roller 42. Each of these support shafts 43 is rotatably inserted into a roll support hole 45, which is provided at the lower section of a support holder 44 of each of the punch holders 41. Here, it is preferred to make the form roller 42 have the same radius as a desired forming radius of the leads 3. The form roller 42 may be adapted for use with a conventional back end equipment which is a kind of semiconductor package mould. Here, the distance 1 between the pair of punch holders 41 is shorter than the distance between the two notches 11 as described above.

During the roll forming of the leads 3 using the roll forming punch die 40, the two support holders 44 of the die 40 are located on and pass through the notches 11 at opposite sides of the leads 3, so that they do not come into contact with part of the lead frame 1 during the roll forming step. Thus, the form roller 42 rolls on the leads 3 while giving a uniform rolling frictional force to the leads 3, thereby bending the leads into the desired shape. As described above, the notching step for forming the notches 11 may be carried out at least before the roll forming step. That is, the notching step may be carried out before, at the same time of or after the trimming step, and yields the same result without affecting the functioning of the present invention.

When rolling on and bending the leads 3, the form roller 42 of the roll forming punch die 40 generates only the rolling frictional force other than the conventional face frictional force, thereby reducing the frictional heat temperature to an extent lower than the plating temperature of the plating material of the lead frame. Hence, the plating material of the lead frame is not melted and does not build up on the contact surface of the form roller or between the fine pitch leads. The fine pitch leads of the lead frame together with the form roller thus achieves a desired quality and improves the productivity of the resulting conductor packages by substantially lowering the number of defective packages.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A process for forming a lead frame of a quad flat (QFP) semiconductor package comprising a trimming step, a lead cutting step, a confirming step for confirming whether a plurality of leads are formed in a predetermined final shape and a package separating step for separating individual semiconductor packages from said lead frame after the leads of each package are formed, the process further comprising:

a roll forming step using a form roller to bend said plurality of leads into a predetermined shape while minimizing the frictional force between said form roller and said leads, said roll forming step being carried out between said trimming step and said lead cutting step; and a notching step for providing a pair of notches on said lead frame at opposite sides of said plurality of leads, said notching step being carried out at least before said roll forming step.

2. A process for forming leads of a quad flat package (QFP) type semiconductor device, comprising the steps of:

feeding a lead frame holding a plurality of QFP type semiconductor devices along a workflow path;

trimming said lead frame to form a dam bar across the leads of each semiconductor device;

notching said lead frame at the same time as the trimming step to provide clearance for a form roller;

roll forming the leads of the semiconductor device with said form roller to form each of the leads of the device into a predetermined shape;

cutting the formed leads into a desired length to produce a finished semiconductor device;

confirming that the formed leads meet a predetermined final shape; and separating the finished semiconductor device from the lead frame.

* * * * *